United States Patent [19]

Marchetti

[11] 4,135,166
[45] Jan. 16, 1979

[54] MASTER TIMING GENERATOR

[75] Inventor: Charles R. Marchetti, Wellesley, Mass.

[73] Assignee: GTE Sylvania Incorporated, Stamford, Conn.

[21] Appl. No.: 899,922

[22] Filed: Apr. 26, 1978

[51] Int. Cl.$^2$ ............................................. H03B 3/04
[52] U.S. Cl. ......................................... 331/14; 331/17
[58] Field of Search .................... 331/14, 17; 325/419, 325/420

[56] References Cited

U.S. PATENT DOCUMENTS

| | | | |
|---|---|---|---|
| 3,869,674 | 3/1975 | Borbely | 331/16 |
| 3,882,412 | 5/1975 | Apple, Jr. | 331/17 |

Primary Examiner—John Kominski
Attorney, Agent, or Firm—Peter Xiarhos

[57] ABSTRACT

A master timing generator capable of tracking an externally generated clock signal and of maintaining desired operation during periods of disruption or perturbation of the clock signal by noise or other high-energy disturbances. The master timing generator includes a voltage controlled oscillator controlled by an input dc control voltage to produce an output signal which is maintained in a particular phase relationship with the clock signal by phase lock loop circuitry coupled to the oscillator. A dc standby voltage signal representative of the value of the control voltage applied to the oscillator is retained during operation of the master timing generator in a standby unit which, in the absence of noise affecting the clock signal, is electrically uncoupled from the oscillator. When the clock signal is affected by noise, an alarm signal representative of this condition is applied to the master timing generator and causes the phase lock loop circuitry to be electrically disengaged from the oscillator and the dc standby voltage signal retained in the standby unit to be switched to the input of the oscillator. This standby voltage signal is employed by the oscillator to produce its desired output signal for so long as the clock signal is affected by noise and the alarm signal representative of this condition is applied to the master timing generator. Upon termination of the alarm signal, the master timing generator returns to its normal mode of operation.

6 Claims, 2 Drawing Figures

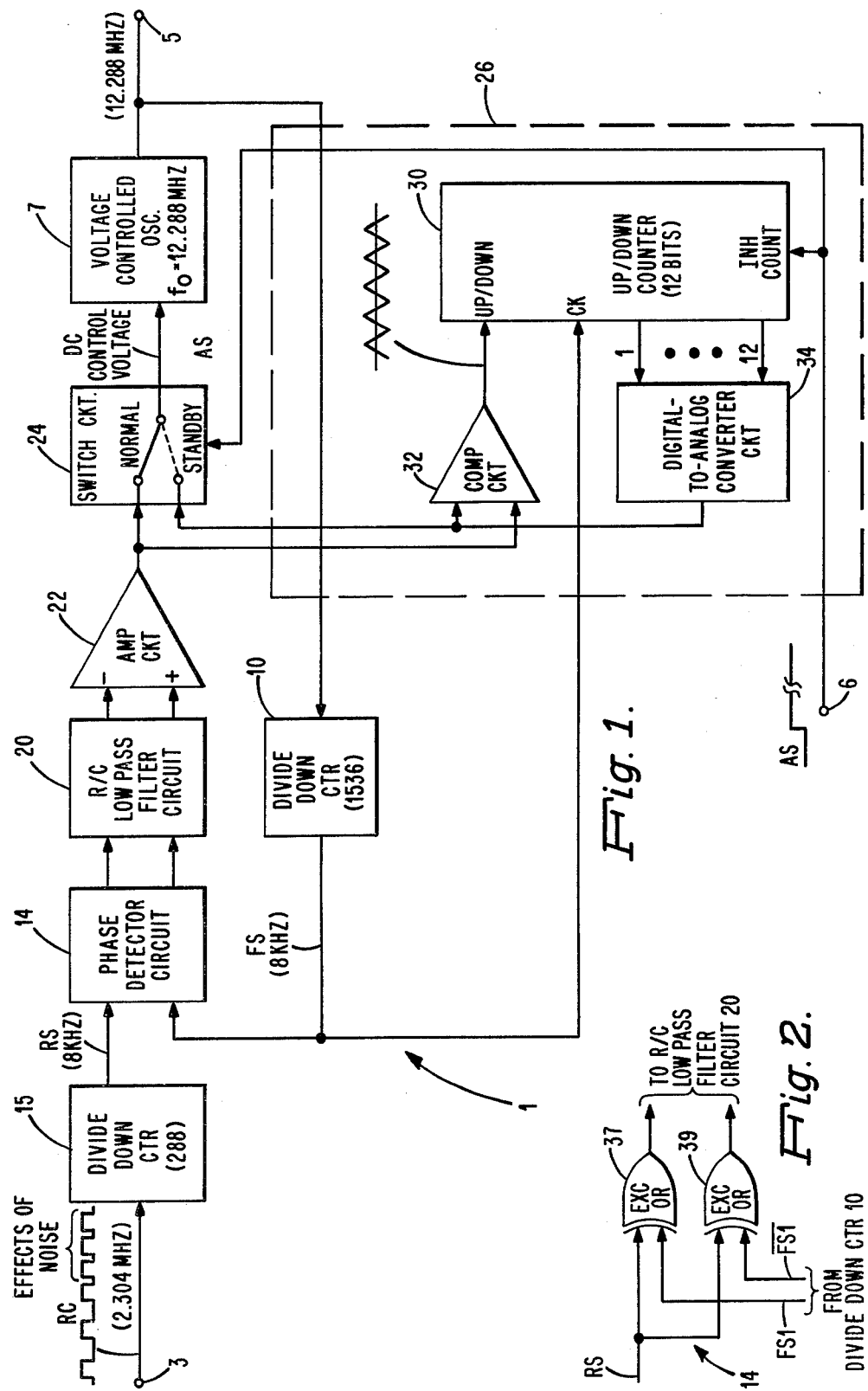

MASTER TIMING GENERATOR

CROSS-REFERENCE TO RELATED APPLICATION

In a co-pending patent application, filed concurrently herewith in the name of Charles R. Marchetti, and entitled NOISE DETECTION CIRCUIT, there is described and claimed a digital noise detection circuit which may be employed with the master timing generator of the present invention.

BACKGROUND OF THE INVENTION

The present invention relates to a master timing generator and, more particularly, to a master timing generator employing phase lock loop techniques and capable of tracking an externally generated clock signal and of maintaining desired operation during periods of perturbation of the clock signal by noise or other high-energy disturbances.

In present day communications and switching systems, especially those requiring a large number of precisely-timed operations, it is important that the timing of these operations be properly and correctly executed even in the presence of noise or other similar high-energy disturbances. By way of example, it is common in many digital communications and switching systems to provide a master timing generator from which all timing signals for the system are derived and which is phase locked to an external clock signal to insure that all timing signals derived from the master timing generator are in proper, precise time and phase relationship. The external clock signal which is employed by the master timing generator for phase locking purposes may be conveniently derived in one common approach by extraction from digital data such as digital diphase data having binary information encoded therein by means of standard conditioned diphase modulation techniques. If the external clock signal is corrupted by noise or other high-energy disturbances, the master timing generator will attempt to track the erroneous signal, thereby causing timing perturbations within the system and, consequently, causing serious synchronization problems within the system and degradation of the performance of the system. It is important in the above situation therefore that the presence of noise be quickly and readily detected so that the operation of the system can be altered during the presence of the noise or other appropriate measures taken to compensate for the presence of the noise. Circuitry by which detection of noise may be accomplished and an appropriate alarm signal produced in response to detection of such noise is described in detail in the aforementioned application of Charles R. Marchetti. The present invention is directed to a master timing generator which may be used with an alarm signal and an externally-generated clock signal as described above for maintaining system synchronization even during periods of perturbation of the clock signal by noise or other high-energy disturbances.

BRIEF SUMMARY OF THE INVENTION

In accordance with the present invention a master timing generator is provided which is operable to produce an output signal synchronized with an input clock signal and to maintain synchronization during periods that the input clock signal is affected by noise.

The master timing generator in accordance with the invention includes a voltage controlled oscillator means adapted to receive input control voltages at an input thereof and operative in response to each said input control voltage to produce a corresponding output signal of a frequency determined by said voltage. A phase lock loop circuit is adapted to receive an input clock signal and the output signals produced by the voltage controlled oscillator means and operates to detect the phase displacement between the input clock signal and each said output signal and to produce a control voltage indicative of said phase displacement. A switch circuit means coupled to the phase lock loop circuit means and to the voltage controlled oscillator means operates in the absence of noise affecting the clock signal to couple each control voltage produced by the phase lock loop circuit means to the input of the voltage controlled oscillator means for causing the voltage controlled oscillator means to produce a corresponding output signal. A standby means coupled to the phase lock loop circuit means and to the switch circuit means operates to receive each control voltage produced by the phase lock loop circuit means and to establish therefrom a corresponding standby control voltage.

The switch circuit means is further operative in accordance with the invention to receive an alarm signal when the input clock signal is affected by noise and in response thereto to uncouple the phase lock loop circuit means from the voltage controlled oscillator means and to couple the then existing standby control voltage established by the standby means just prior to the occurrenc of the alarm signal to the input of the voltage controlled oscillator means to cause the voltage controlled oscillator means to produce a corresponding output signal for the duration that the switch circuit means receives the alarm signal.

BRIEF DESCRIPTION OF THE INVENTION

Various objects, features and advantages of a master timing generator in accordance with the invention will be apparent from the following description taken in conjunction with the accompanying drawing in which:

FIG. 1 is a block diagram of a master timing generator in accordance with the present invention; and FIG. 2 is a schematic diagram of a phase detector circuit employed in the master timing generator of FIG. 1.

DETAILED DESCRIPTION OF THE INVENTION

Referring now to FIG. 1, there is shown a master timing generator 1 in accordance with the present invention. The master timing generator 1 is adapted to receive an externally-generated clock signal RC at an input terminal 3 and to produce a master output signal at an output terminal 5 which is synchronized with the clock signal RC even during periods of disruption or perturbation of the signal RC by noise or other high-energy disturbances. The operation of the master timing generator 1 during periods that the clock signal RC is affected by noise is controlled by an alarm signal AS applied to a control terminal 6 during the times that the clock signal RC is affected by noise. One form of suitable circuitry by which the signals RC and AS may be derived is described in detail, and claimed, in the aforementioned co-pending application of Charles R. Marchetti. By way of example, the clock signal RC may be extracted, or recovered, from a sinusoidal diphase signal having binary information encoded therein by means of standard conditioned diphase modulation techniques, and the alarm signal AS may be derived from the clock signal RC during times of disruption of the clock signal by noise. A typical frequency of the clock signal RC is 2.304 Mhz.

The master output signal produced at the output terminal 5 of the master timing generator 1 is derived from a voltage controlled oscillator 7 under the control of a dc control voltage applied to the input thereof and derived in accordance with a phase lock loop mode of operation. More particularly, the output signal of the voltage controlled oscillator 7 in response to a dc voltage applied to its input is converted, or divided down in frequency by a divide down counter 10, for example, by a divisor factor 1536, and applied as a feedback signal FS to a phase detector circuit 14. This feedback signal FS is compared in phase in the phase detector circuit 14 with a reference signal RS derived in the absence of noise affecting the clock signal RC by dividing down the frequency of the signal RC (e.g., 2.304 Mhz) in a second divide down counter 15, for example, by a divisor factor of 288. At the center frequency ($f_o$) of the voltage controlled oscillator 7, typically 12.288 Mhz, the feedback signal FS produced by the divide down counter 10 from the center frequency signal of the oscillator 7 has a frequency of 8 Khz and, similarly, the reference signal RS produced by the divide down counter 15 from the clock signal RC (e.g., 2.304 Mhz) also has a frequency of 8 Khz, the 8 Khz frequency representing a convenient operating frequency for the phase detector circuit 14 and the subsequent circuitry.

When the reference signal RS and the feedback signal FS applied to the phase detector circuit 14 are phase displaced with respect to each other by a certain amount, for example, 90°, the dc voltage applied to the input of the voltage controlled oscillator 7 has a value of 0 volts, causing the oscillator 7 to operate at its center frequency and to produce a master output signal at the output terminal 3 of the aforementioned frequency of 12.288 Mhz. The 0-volt control voltage for the oscillator 7 is established by the aforementioned phase detector circuit 14 in conjunction with an R/C low pass filter circuit 20, an amplifier circuit 22 and a switch circuit 24. More specifically, when the reference signal RS and the feedback signal FS are phase displaced by 90°, a pair of output signals indicative of this phase condition are produced by the phase detector circuit 14, in a manner to be described more fully hereinafter in connection with FIG. 2, and filtered (or averaged) by the low pass filter circuit 20 to derive a pair of dc voltages at outputs thereof of opposite polarity and having the same value, for example, 2.2 volts dc. The pair of voltages produced by the low pass filter circuit 20 are applied to corresponding inputs of the amplifier circuit 22. The amplifier circuit 22 is arranged so that with the two inputs thereto at the same voltage, that is, 2.2 volts dc, it operates to produce an output voltage of 0 volts dc. This 0-volt signal is applied to the switch circuit 24 which, in the absence of an alarm signal AS indicating the presence of noise affecting the clock signal RC, operates in a so-called "normal" state and thereby couples the 0-volt signal as a control voltage to the input of the oscillator 7. The switch circuit 24 is shown schematically in FIG. 1 but may be implemented in practice by a solid state switch.

When the reference signal RS and the feedback signal FS applied to the phase detector circuit 14 are phase displaced with respect to each other by other than 90°, either in a leading sense or a lagging sense, as may occur, for example, during system initialization, a pair of output signals indicative of the phase displacement are produced by the phase detector circuit 14 but the pair of dc voltages derived by the low pass filter circuit 20 are of different values (and polarity) as determined by the direction and extend of phase displacement between the reference signal RS and the feedback signal FS. In this case, the amplifier circuit 22 operates to amplify the difference between the two voltages and to produce an output voltage having a value related to the extent of phase displacement and having either a positive polarity (in the case of a lead situation) or a negative polarity (in the case of a lag situation). This output voltage is coupled through the switch circuit 24 and serves either to increase (in the case of a lead situation) or decrease (in the case of a lag situation) the frequency of the oscillator 7 so that the output signal of the oscillator 7, after being divided down by a factor of 1536 in the divide down counter 10, is phase displaced with respect to the reference signal RS in a direction to re-establish the aforementioned 90° phase relationship corresponding to the desired center frequency operation of the oscillator 7. The above phase lock loop operations take place for so long as the reference signal RS and the feedback signal FS are phase displaced with respect to each other by other than 90°.

As the abovedescribed phase lock loop operations take place to establish the desired center frequency operation (12.288 Mhz) of the oscillator 7, the value of the dc control voltage applied to the variable controlled oscillator 7 is retained in a standby unit 26 which includes an up/down counter 30, a comparator circuit 32 and a digital-to-analog converter circuit 34. As will be discussed more fully hereinafter, this control voltage, which is represented by 12 bits in the counter 30 and converted to analog form by the converted circuit 34, is employed by the master timing generator 1 during periods that the clock signal RC is affected by noise.

As indicated in FIG. 1, the dc output voltage of the amplifier circuit 22, that is, the dc control voltage for the oscillator 7, is applied to a first input of the comparator circuit 32 and a second dc voltage is applied to a second input of the comparator circuit 32 by the digital-to-analog converter circuit 34. The digital-to-analog converter circuit 34 operates to convert each binary count of the up/down counter 30 to a dc standby voltage representative of this count. When the dc voltages at the inputs of the comparator circuit 32 are the same, this is an indication that the count in the counter 30 represents the actual value of the control voltage applied to the variable control oscillator 7. When the dc voltage at one of the inputs of the comparator circuit 32 is greater than the dc voltage at the other input, an output signal of a first polarity is produced by the comparator circuit 32 and applied to an up/down input of the counter 30 to cause the counter 30 to be clocked upwardly in count. Similarly, when the dc voltage at the said one of the inputs of the comparator circuit 32 is less than the dc voltage at the other input, an output signal of a second polarity is produced by the comparator circuit 32 and applied to the up/down input of the counter 30 to cause the counter 30 to be clocked downwardly in count. The clocking of the counter 30 during the above operations is accomplished by means of the feedback signal FS at the output of the divide down counter 10.

The changing of the count of the counter 30 as described above takes place until the dc voltages at the inputs of the comparator circuit 32 are of the same value, indicating that the count then in the counter 30 represents the value of the dc control voltage applied to the oscillator 7. After this condition is achieved, the counter 30 is alternately clocked up and down one count from the count then present in the counter 32, as indicated in FIG. 1. At the center frequency operation of the oscillator 7, the voltage established at the output of the digital-to-analog converter 34 has a value of 0 volts dc.

As indicated previously, in the absence of noise affecting the clock signal RC, the dc control voltage for controlling the voltage controlled oscillator 7 is derived in a phase lock loop manner by the circuit elements 10, 14, 20 and 22 and coupled through the switch circuit 24, which is in its "normal" state, to the input of the oscillator 7. As long as the clock signal RC is unaffected by noise, the oscillator 7 is able to track the clock signal RC and produce a master output signal which is synchronized with the clock signal RC. If the clock signal RC is affected by noise, however, so that the pulses of the clock signal RC become very close together as indicated in FIG. 1, the reference signal RS will change erratically as the divide down counter 15 divides down the noise-affected signal RC and the phase lock loop circuit elements will attempt to cause the oscillator 7 to erroneously track this reference signal. Since such a manner of operation cannot be tolerated in modern communications and switching systems with which the master timing generator 1 is intended to be used, it becomes necessary to provide some manner by which the master timing generator 1 is able to function in its desired manner, or some close approximation thereto, even during periods that the clock signal RC is affected by noise.

This desired manner of operation is achieved in accordance with the present invention by the utilization of the aforedescribed up/down counter 30, comparator circuit 32 and digital-to-analog converter circuit 34, in conjunction with the switch circuit 24 and an alarm signal AS at the control terminal 6. More specifically, during each period that the clock signal RC is affected by noise, an alarm signal AS is applied to the control terminal 6 and is coupled in common to a control input of the switch circuit 24 and to an inhibit count input of the up/down counter 30. The alarm signal AS causes the up/down counter 30 to "freeze" the count therein (that is, the clock signals are inhibited) and cause the switch circuit 24 to be switched from its "normal" state to a "standby" state, as schematically indicated in FIG. 1, thereby electrically disabling or disengaging the phase lock loop circuit elements from the oscillator 7. As a result of these changes, the dc voltage then present at the output of the digital-to-analog converter circuit 34, representing the value of the dc control voltage established just prior to the occurrence of the alarm signal AS, is caused to be applied to and coupled through the switch circuit 24 to the input of the oscillator 7. This dc control voltage is accordingly used to control the oscillator 7 for such time as the alarm signal AS is present at the terminal 6, that is, for such time as the clock signal RC is affected by noise. Upon termination of the noise and, thus, the alarm signal AS, the switch circuit 24 switches back to its "normal" state, the counter 30 recommences its normal counting operations, and the phase lock loop manner of operation recommences, as previously discussed. It will be appreciated, therefore, that the utilization of the count in the counter 30 and the digital-to-analog converter circuit 34 during a period of noise allows essentially normal operation of the oscillator 7 during the period of such noise so that the output signal of the oscillator 7 remains synchronized with the clock signal RC.

Although the phase detector circuit 14 as generally described above may be implemented in any one of several possible ways, one particularly useful and simple configuration for the phase detector circuit 14 is shown in FIG. 2. As shown in FIG. 2, the phase detector circuit 14 comprises a pair of EXCLUSIVE OR logic gates 37 and 39. The aforedescribed reference signal RS is applied in common to first inputs of both of the gates 37 and 39 and a pair of signals FS1 and $\overline{FS1}$ (the inverse of FS1) from the output stage of the divide down counter 10 are applied respectively to second inputs of the gates 37 and 39. When the signals RS and FS1 and the signals RS and $\overline{FS1}$ are phase displaced with respect to each other by 90°, binary "1" output pulses are produced by the gate 37 when the signals RS and FS1 have opposite binary values and, similarly, binary "1" output pulses are produced by the gate 39 when the signals RS and $\overline{FS1}$ have opposite binary values. When the output pulse trains of the gates 37 and 39 are filtered by the R/C low pass filter circuit 20 (FIG. 1) coupled to the gates 37 and 39, dc signals are produced by the low pass filter circuit 20 having values (e.g., ±2.2 volts) indicative of the 90° phase displacement between the aforementioned signals RS, FS1 and RS, $\overline{FS1}$. When the phase displacement between these signals changes from the 90° situation, in either a lead sense or a lag sense, the duration of the binary "1" output pulses of the gates 37 and 39 changes from the 2.2 volt value with the result that the dc voltages produced by the associated low pass filter circuit 20 changes, leading to changes in the values of the voltages applied to the amplifier circuit 22 and, thus, the value of the dc control voltage applied to the oscillator 7.

While there has been described what is considered to be a preferred embodiment of the invention, it will be apparent to those skilled in the art that various changes and modifications may be made therein without departing from the invention as called for in the appended claims.

What is claimed is:

1. A master timing generator operable to produce an output signal synchronized with an input clock signal and to maintain synchronization during periods that the input clock signal is affected by noise, said master timing generator comprising:
    voltage controlled oscillator means adapted to receive input control voltages at an input thereof and operative in response to each said input control voltage to produce a corresponding output signal of a frequency determined by said voltage;
    phase lock loop circuit means adapted to receive an input clock signal and the output signals produced by the voltage controlled oscillator means and operative to detect the phase displacement between the input clock signal and each said output signal and to produce a control voltage indicative of said phase displacement;
    switch circuit means coupled to the phase lock loop circuit means and to the voltage controlled oscillator means and operative in the absence of noise affecting the clock signal to couple each control voltage produced by the phase lock loop circuit means to the input of the voltage controlled oscillator means for causing the voltage controlled oscillator means to produce a corresponding output signal;

standby means coupled to the phase lock loop circuit means and to the switch circuit means and operative to receive each control voltage produced by the phase lock loop circuit means and to establish therefrom a corresponding standby control voltage; and said switch circuit means being further operative to receive an alarm signal when the input clock signal is affected by noise and in response thereto to uncouple the phase lock loop circuit means from the voltage controlled oscillator means and to couple the then existing standby control voltage established by the standby means just prior to the occurrence of the alarm signal to the input of the voltage controlled oscillator means to cause the voltage controlled oscillator means to produce a corresponding output signal for the duration that the switch circuit means receives the alarm signal.

2. A master timing generator in accordance with claim 1 wherein the standby means comprises:

first circuit means operable to establish a digital signal therein corresponding to each control voltage produced by the phase lock loop circuit means; and second circuit means coupled to the first circuit means and operable to convert each digital signal established by the first circuit means to a corresponding standby control voltage.

3. A master timing generator in accordance with claim 2 wherein: the first circuit means includes a binary counter.

4. A master timing generator in accordance with claim 3 wherein: the second circuit means includes a digital-to-analog converter.

5. A master timing generator in accordance with claim 1 wherein the standby means includes:

up/down binary counter means having an up/down input for receiving first and second control signals for causing the counter means to count in a binary fashion upwardly or downwardly, respectively;

digital-to-analog converter means coupled to the up/down counter means and operative to convert each binary count of the up/down counter means to a corresponding standby voltage;

comparator circuit means having a first input coupled to the digital-to-analog converter means and adapted to receive each voltage produced by the digital-to-analog converter means, a second input coupled to the phase lock loop circuit means and adapted to receive each voltage produced by the phase lock loop circuit means, and an output coupled to the up/down input of the up/down counter means, said comparator circuit means being operative when the voltage at the first input is greater than the voltage at the second input to produce a first control signal at its output and at the up/down input of the up/down counter means to cause the up/down counter means to count downwardly until the voltage established at the first input by the digital-to-analog converter means is the same as the voltage at the second input, and operative when the voltage at the first input is less than the voltage at the second input to produce a second control signal at its output and at the up/down input of the up/down counter means to cause the up/down counter means to count upwardly until the voltage established at the first input by the digital-to-analog converter means is the same as the voltage at the second input.

6. A master timing generator in accordance with claim 5 wherein:

the up/down counter means further has an inhibit count input adapted to receive the alarm signal and operative in response to said alarm signal to freeze the count therein, whereby the standby voltage produced by the digital-to-analog converter means is maintained at the value corresponding to the count frozen in the up/down counter means.

* * * * *